United States Patent
Lai

(10) Patent No.: US 8,869,386 B2
(45) Date of Patent: Oct. 28, 2014

(54) DEVICE FOR PRECISE ASSEMBLY OF LIGHT RECEIVER ON SUBSTRATE

(71) Applicant: Hon Hai Precision Industry Co., Ltd., New Taipei (TW)

(72) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/931,768

(22) Filed: Jun. 28, 2013

(65) Prior Publication Data

US 2014/0215814 A1  Aug. 7, 2014

(30) Foreign Application Priority Data

Feb. 5, 2013  (TW) .................................. 102104295

(51) Int. Cl.
*H05K 13/08* (2006.01)
*H05K 3/32* (2006.01)
*F21V 21/00* (2006.01)

(52) U.S. Cl.
CPC ..................................... *F21V 21/00* (2013.01)
USPC .................. 29/743; 29/593; 29/729; 29/739; 29/740; 29/741

(58) Field of Classification Search
CPC .................................. H05K 13/08; H05K 3/32
USPC ............ 29/593, 729, 738, 739–743, 758–761
See application file for complete search history.

(56) References Cited

U.S. PATENT DOCUMENTS

| | | | | |
|---|---|---|---|---|
| 3,499,203 | A * | 3/1970 | Schuelke et al. | 29/710 |
| 5,155,903 | A * | 10/1992 | Nakashima et al. | 29/832 |
| 7,325,298 | B2 * | 2/2008 | Kobayashi et al. | 29/740 |
| 7,488,388 | B2 * | 2/2009 | Ryu et al. | 118/664 |
| 8,359,735 | B2 * | 1/2013 | Ban et al. | 29/740 |
| 8,581,500 | B2 * | 11/2013 | Kim et al. | 315/134 |
| 2005/0140911 | A1 * | 6/2005 | Ryu et al. | 349/153 |
| 2007/0074387 | A1 * | 4/2007 | Ieizumi et al. | 29/739 |
| 2007/0094868 | A1 * | 5/2007 | Ieizumi et al. | 29/743 |
| 2009/0229118 | A1 * | 9/2009 | Haugen | 29/740 |
| 2010/0085715 | A1 * | 4/2010 | Scheifers et al. | 361/743 |
| 2010/0263203 | A1 * | 10/2010 | Ban et al. | 29/743 |
| 2012/0081101 | A1 * | 4/2012 | Suozzo et al. | 324/66 |
| 2012/0146516 | A1 * | 6/2012 | Kim et al. | 315/134 |

* cited by examiner

*Primary Examiner* — Peter DungBa Vo
*Assistant Examiner* — Kaying Kue
(74) *Attorney, Agent, or Firm* — Novak Druce Connolly Bove + Quigg LLP

(57) ABSTRACT

A device includes a vacuum nozzle, a driver, a light source, a measuring unit, and a controller. The vacuum in the nozzle picks up and holds a light receiver. The driver drives the nozzle to press the light receiver onto a substrate such that the light receiver is electrically connected to the substrate. A light source in the nozzle illuminates the light receiver causing the generation of a first electrical signal. The measuring unit measures a second electrical signal that is a part of the first electrical signal, and the driver is controlled drive the nozzle to press harder until the second electrical signal stops increasing, the degree of conductivity between the light receiver and the substrate being then at the maximum.

7 Claims, 1 Drawing Sheet

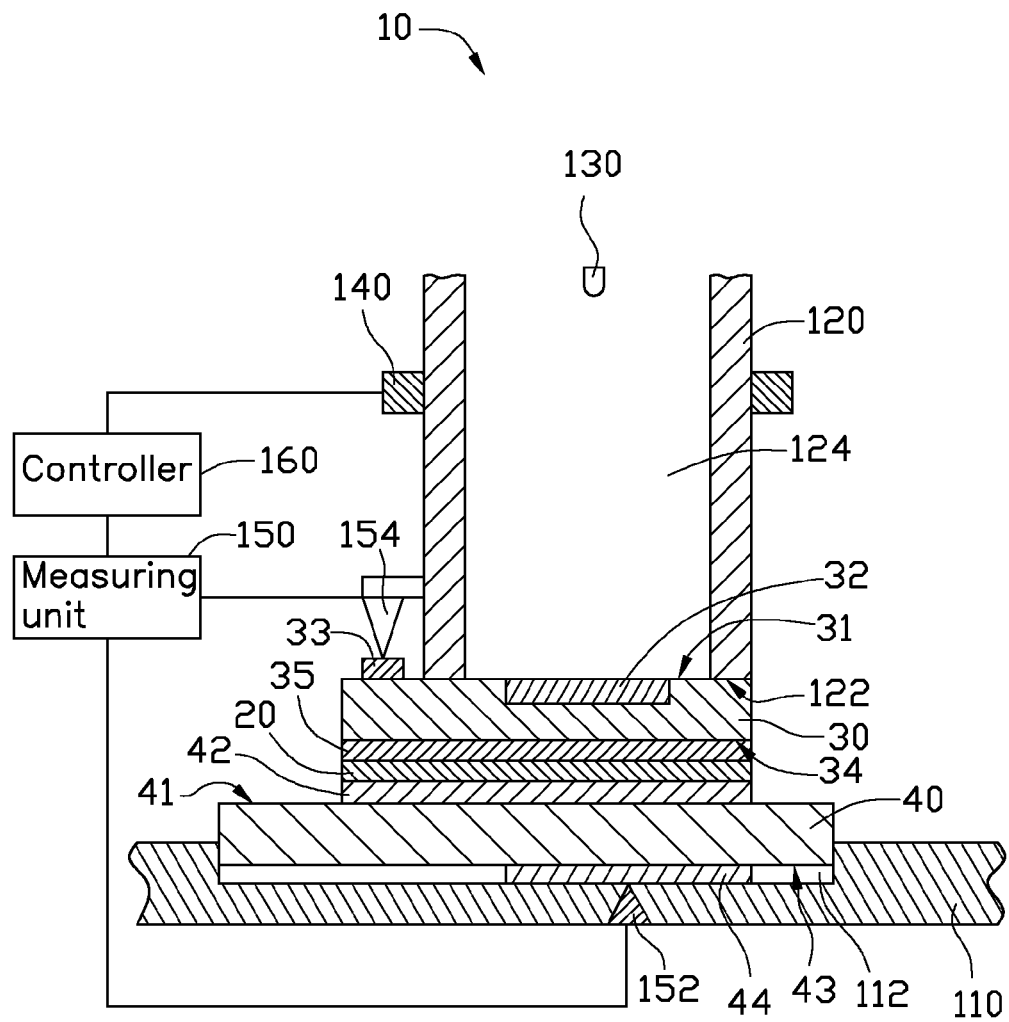

DEVICE FOR PRECISE ASSEMBLY OF LIGHT RECEIVER ON SUBSTRATE

BACKGROUND

1. Technical Field

The present disclosure relates to optical connectors and, more particularly, to a device for assembling a light receiver on a substrate.

2. Description of Related Art

Optical connectors include a substrate and a light receiver such as a photo diode positioned on and electrically connected to the substrate via conductive glue. In assembly, to reduce light loss, the light receiver is pressed to the substrate to reduce contact resistance between the light receiver and the substrate. However, if the pressure is over heavy, the light receiver may be damaged.

Therefore, it is desirable to provide a device for assembling a light receiver on a substrate, which can overcome the above-mentioned problems.

BRIEF DESCRIPTION OF THE DRAWING

Many aspects of the present disclosure can be better understood with reference to the following drawing. The components in the drawing are not necessarily drawn to scale, the emphasis instead being placed upon clearly illustrating the principles of the present disclosure.

The drawing is a schematic view of a device for assembling a light receiver onto a substrate, according to an embodiment.

DETAILED DESCRIPTION

Embodiments of the present disclosure will be described with reference to the drawing.

Referring to the drawing, a device 10, according to an embodiment, assembles a light receiver 30 onto a substrate 40 using a layer of conductive glue 20.

The light receiver 30 includes a first surface 31, a sensing zone 32 formed in the first surface 31, a plate-shaped first electrode 33 positioned on the first surface 31 and located outside the sensing zone 32, a second surface 34 opposite to the first surface 31, and a plate-shaped second electrode 35 covering the second surface 34.

The conductive glue 20 is applied to a surface of the second electrode 35 facing away from the second surface 34.

The substrate 40 includes a third surface 41, a soldering pad 42 positioned on the third surface 41 and corresponding to the second electrode 35 in shape and size, a fourth surface 43 opposite to the third surface 41, and a contact 44 positioned on the fourth surface 43 and electrically connected to the soldering pad 42.

The device 10 includes a tray 110, a vacuum nozzle 120, a light source 130, a driver 140, a measuring unit 150, and a controller 160.

The tray 110 defines a recess 112 for receiving the substrate 40.

The nozzle 120 attracts and holds the first surface 31 by means of a vacuum and covers the sensing zone 32. In detail, the nozzle 120 includes a holding surface 122 contacting the first surface 31 and a hole 124 defined in the holding surface 122 and communicating with a vacuum pump (not shown) to maintain a low air pressure.

The light source 130 such as a light emitting diode and a laser diode is received in the nozzle 120 (i.e., the hole 124) and emits light to illuminate the sensing zone 32. The sensing zone 32 is received within the hole 124 and exposed to the light source 130. The light receiver 30 is thus activated to generate a first electrical signal and transmit the first electrical signal out via the first electrode 33 and the second electrode 35.

The driver 140, such as a mechanical arm, is positioned around the tray 110 and is connected to the nozzle 120. The driver 140 moves the second electrode 35 to align it with the soldering pad 42 and then place the light receiver 30 onto the substrate 40.

The measuring unit 150 includes a first probe 152 and a second probe 154. The first probe 152 is buried in the tray 110 and makes electrical contact with the contact 44. The second probe 154 is connected to the nozzle 120 and contacts the first electrode 33 when the light receiver 30 is pressed by the nozzle 120 onto the substrate 40. The measuring unit 150 instantaneously measures a second electrical signal, which is a part of the first electrical signal that passes to the substrate 40 when the light receiver 30 is pressed by the nozzle 120 onto the substrate 40.

In particular, during the pressing, the conductive glue 20 is compressed and becomes thinner and thinner until the conductive glue 20 is compressed to the maximum degree. As such, electrical resistance between the light receiver 30 and the substrate 40 decreases to the most minimal amount when the conductive glue 20 is compressed to the maximum degree. Thus, the strength of the second electrical signal is at the greatest level when the conductive glue 20 is compressed to the maximum degree. That is, after the conductive glue 20 is compressed to the maximum degree, the second electrical signal remains unchanged, or can only decrease in strength, and the light receiver 30 might suffer damage from any increase in physical pressure.

The measuring unit 150 can be a charging-rate meter, an ammeter, or a voltmeter. Accordingly, the first electrical signal and the second electrical signal are charging rate, outright current, or voltage level.

The controller 160 controls the driver 140 to press the light receiver 30 according to the second electrical signal. In detail, the controller 160 controls the driver 140 to keep pressing the light receiver 30 until the second electrical signal stops increasing in strength.

As such, the device 10 can instantaneously monitor the pressing to reduce insertion loss while avoiding damage to the light receiver 30.

To increase efficiency, in other embodiments, the tray 110 can define a number of the recesses 112, which can be arrayed, for receiving a large number of the substrates 40. Accordingly the measuring unit 150 can include a number of the first probes 152 to make contact with the number of the contacts 44.

It will be understood that the above particular embodiments are shown and described by way of illustration only. The principles and the features of the present disclosure may be employed in various and numerous embodiments thereof without departing from the scope of the disclosure. The above-described embodiments illustrate the possible scope of the disclosure but do not restrict the scope of the disclosure.

What is claimed is:

1. A device for mounting a light receiver on a substrate, comprising:
    a nozzle configured to suck a light receiver;
    a driver configured to drive the nozzle to press the light receiver onto a substrate such that the light receiver is electrically connected to the substrate;
    a light source received in the nozzle and configured to emit light to illuminate the light receiver, the light receiver thus generating a first electrical signal;

a measuring unit configured to measure a second electrical signal that is a part of the first electrical signal passing to the substrate; and a controller configured to control the driver to drive the nozzle to keep pressing the light receiver until the second electrical signal stop increasing.

2. The device for mounting a light receiver on a substrate of claim 1, wherein the light receiver comprises a first surface, a sensing zone formed in the first surface, a plate-shaped first electrode positioned on the first surface and located outside the sensing zone, a second surface opposite to the first surface, and a plate-shaped second electrode covering the second surface, the nozzle is configured to suck the first surface and cover the sensing zone, the nozzle includes a holding surface contacting the first surface and a negative pressure hole defined in the holding surface, the light source is received in the hole, and the sensing zone is received within the hole and exposed to the light source.

3. The device for mounting a light receiver on a substrate of claim 2, comprising a tray, the tray defining a recess for receiving the substrate, wherein the substrate comprises a third surface, a soldering pad positioned on the third surface and corresponding to the second electrode in shape and size, a fourth surface opposite to the third surface, and a contact positioned on the fourth surface and electrically connected with the soldering pad, the soldering pad contacts the second electrode when the light receiver is pressed to the substrate.

4. The device for mounting a light receiver on a substrate of claim 3, wherein the measuring unit comprises a first probe and a second probe, the first probe is buried in the tray and contacts the contact, and the second probe is connected to the nozzle and contacts the first electrode when the light receiver is pressed by the nozzle to the substrate.

5. The device for mounting a light receiver on a substrate of claim 1, wherein the light source is a light emitting diode or a laser diode.

6. The device for mounting a light receiver on a substrate of claim 1, wherein the driver is a mechanical arm.

7. The device for mounting a light receiver on a substrate of claim 1, wherein the measuring unit is a charge meter, an ammeter, or a voltmeter, and the first electrical signal and the second electrical signal are charge, current, or voltage respectively.

* * * * *